United States Patent
Sung et al.

(10) Patent No.: US 12,207,488 B2
(45) Date of Patent: Jan. 21, 2025

(54) DISPLAY DEVICE

(71) Applicant: Samsung Display Co., Ltd., Yongin-si (KR)

(72) Inventors: Woo Yong Sung, Seoul (KR); Jeongseok Lee, Yongin-si (KR); Sehoon Jeong, Suwon-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 513 days.

(21) Appl. No.: 17/521,291

(22) Filed: Nov. 8, 2021

(65) Prior Publication Data

US 2022/0246878 A1    Aug. 4, 2022

(30) Foreign Application Priority Data

Jan. 29, 2021    (KR) .......................... 10-2021-0013627

(51) Int. Cl.
*H10K 50/84*    (2023.01)

(52) U.S. Cl.
CPC .................................. *H10K 50/84* (2023.02)

(58) Field of Classification Search
CPC .................................................... H01K 50/84
See application file for complete search history.

(56) References Cited

U.S. PATENT DOCUMENTS

| | | | |
|---|---|---|---|
| 9,070,715 B2 | 6/2015 | Shin et al. | |
| 2012/0262660 A1 | 10/2012 | Fujiwara et al. | |
| 2015/0108439 A1 | 4/2015 | Kim et al. | |
| 2017/0338294 A1 | 11/2017 | Choi et al. | |
| 2018/0190936 A1 | 7/2018 | Lee et al. | |
| 2019/0081255 A1* | 3/2019 | Kim | B32B 3/04 |
| 2019/0237690 A1 | 8/2019 | Park et al. | |
| 2020/0111992 A1 | 4/2020 | Kwon et al. | |
| 2020/0170126 A1* | 5/2020 | Ahn | G09F 9/33 |
| 2021/0016538 A1 | 1/2021 | Kwon et al. | |

FOREIGN PATENT DOCUMENTS

| | | |
|---|---|---|
| KR | 10-2015-0039024 | 4/2015 |
| KR | 10-1849875 | 4/2018 |
| KR | 10-1975866 | 5/2019 |
| KR | 10-1988014 | 6/2019 |
| KR | 10-2019-0127161 | 11/2019 |
| KR | 10-2020-0039864 | 4/2020 |
| KR | 10-2020-0063379 | 6/2020 |

OTHER PUBLICATIONS

Partial European Search Report dated Jun. 30, 2022, for European Patent Application No. 22154028.9.

* cited by examiner

*Primary Examiner* — Mary Ellen Bowman
(74) *Attorney, Agent, or Firm* — CANTOR COLBURN LLP

(57) ABSTRACT

A display device includes a front area, a side area, a display panel, and a protective element. The side area peripheral to sides of the front area. The display panel includes a flat surface in the front area and a curved surface in the side area. The protective element is disposed on a lower surface of the display panel. The protective element has different thicknesses in the front area and the side area.

23 Claims, 18 Drawing Sheets

DISPLAY DEVICE

CROSS-REFERENCE TO RELATED APPLICATIONS

This application claims priority to and the benefit of Korean Patent Application No. 10-2021-0013627, filed Jan. 29, 2021, which is hereby incorporated by reference for all purposes as if fully set forth herein.

BACKGROUND

Field

Embodiments generally relate to a display device, and, more specifically, to a display device having a curved surface.

Discussion

A display device is a device displaying an image by emitting light. The display device may include a window transmitting light, a display panel disposed under the window and emitting light, and a protective element disposed under the display panel and protecting the display panel. Conventionally, a display panel having only a flat surface has been used, but a display panel having various curved surfaces is gaining traction. Generally, a display device including the display panel having various curved surfaces may be manufactured by attaching the display panel to a lower surface of the window. When the display panel including a curved surface is attached to the window, bubbles may occur in the curved part. The bubbles may absorb or refract light emitted from the display panel, and thus, display performance of the display device may be deteriorated.

The display panel may include a plurality of curved surfaces and a corner surface (for example, located adjacent to a corner of the display panel) positioned between two adjacent curved surfaces among the plurality of curved surfaces. When the corner surface of the display panel is attached to the window, buckling or wrinkling may occur. Accordingly, display performance of the display device may be deteriorated.

The above information disclosed in this section is only for understanding the background of the inventive concepts, and, therefore, may contain information that does not form prior art.

SUMMARY

Some embodiments provide a display device with improved display quality.

Additional aspects will be set forth in the detailed description which follows, and, in part, will be apparent from the disclosure, or may be learned by practice of the inventive concepts.

According to an embodiment, a display device includes a front area, a side area, a display panel, and a protective element. The side area extends from each of opposing sides of the front area. The display panel includes a flat surface in the front area and a curved surface in the side area. The protective element is disposed on a lower surface of the display panel. The protective element has different thicknesses in the front area and the side area.

According to an embodiment, a display device includes a front area, side areas, a corner area, a display panel, and a protective element. The side areas are disposed peripheral to the front area. The corner area is disposed between two adjacent side areas among the side areas. The display panel includes a flat surface in the front area and a curved surface in the side areas and the corner area. The display panel further includes a groove having an inwardly recessed shape in the corner area. The protective element is disposed on a lower surface of the display panel. The protective element fills at least a portion of the groove.

According to some embodiments, when a display panel is attached to a window, bubbles may be reduced in a side area in a manner that display quality can be improved.

According to some embodiments, buckling or wrinkling may not occur in a corner area of a display panel in a manner that display quality can be improved.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts.

DETAILED DESCRIPTION OF SOME EMBODIMENTS

Figure 1A:
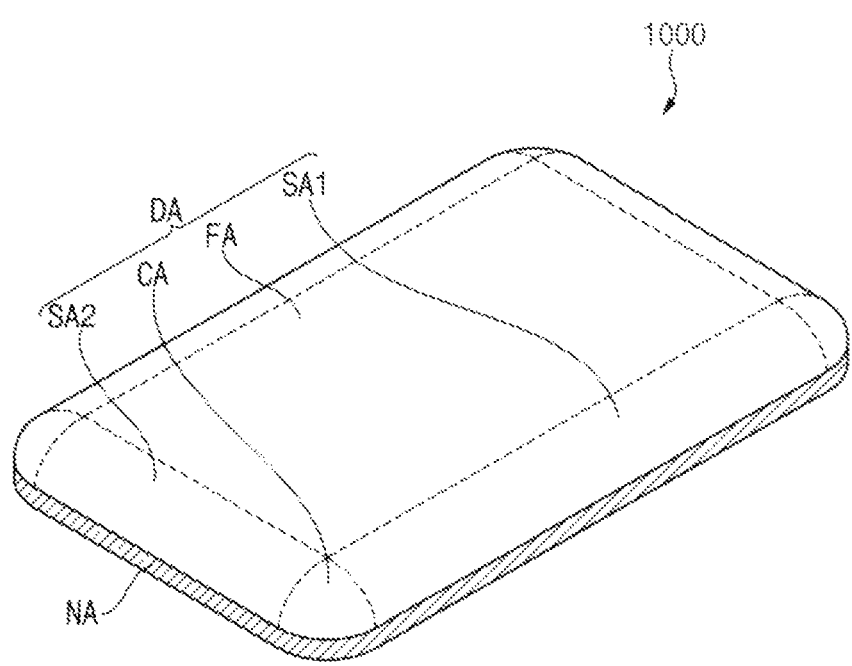
FIGS. 1A and 1B are diagrams illustrating a display device according to some embodiments.

In the following description, for the purposes of explanation, numerous specific details are set forth in order to provide a thorough understanding of various embodiments.

As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

Figure 1B:
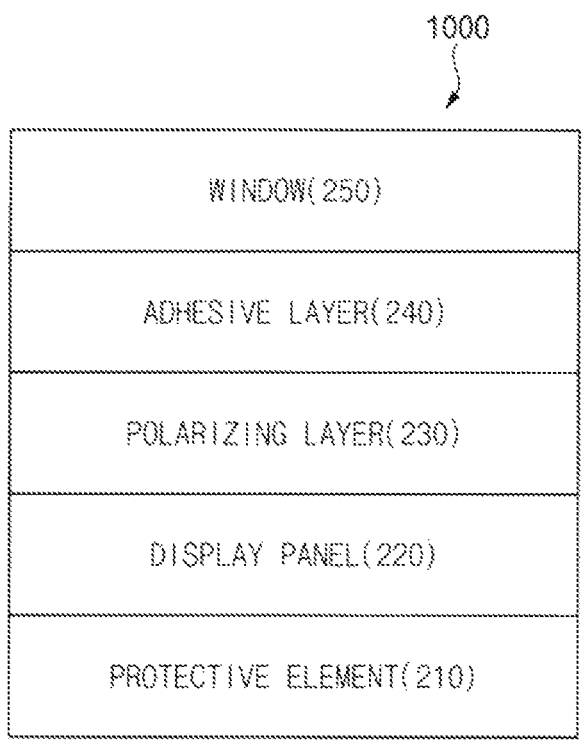

FIGS. 1A and 1B are diagrams illustrating a display device according to some embodiments.

FIG. 1A is a perspective view illustrating a display device according to an embodiment.

Referring to FIG. 1A, a display device 1000 may include a display area DA and a non-display area NA. The display area DA may be an area capable of displaying an image by emitting light. The display area DA may include a front area FA, first and second side areas SA1 and SA2 positioned adjacent to (e.g., around) the front area FA, and a corner area CA positioned between two adjacent side areas among the first and second side areas SA1 and SA2. The display device 1000 may have a flat surface as the front area FA, and may have a curved surface as the first and second side areas SA1 and SA2, and the corner area CA.

The non-display area NA may be an area not emitting light, and may include a driving circuit for driving the display area DA.

FIG. 1B is a diagram illustrating a structure of a display device according to an embodiment.

Referring to FIG. 1B, the display area DA of the display device 1000 may include a window 250, an adhesive layer 240 disposed under the window 250, a polarizing layer 230 disposed under the adhesive layer 240, a display panel 220 disposed under the polarizing layer 230, and protective element 210 disposed under the display panel 220.

The window 250 may transmit light emitted from the display panel 220. The window 250 may include an insulating material, such as transparent plastic or glass. The window 250 may be attached to the polarizing layer 230 or the display panel 220 through the adhesive layer 240. The window 250 may include a curved surface in some areas (for example, side areas SA1 and SA2, or corner area CA of FIG. 1A).

The adhesive layer 240 may include, for instance, at least one of an optically clear adhesive (OCA), an optically clear resin (OCR), and a pressure sensitive adhesive (PSA). The adhesive layer 240 may transmit light. The adhesive layer 240 may be disposed under the window 250 to provide adhesive force to the window 250.

External light may enter the display device 1000. The external light may be reflected from various electrodes or wires included in the display panel 220. The polarizing layer 230 may prevent the external light from being reflected and visually recognized. In some embodiments, the display device 1000 may not include the polarizing layer 230, and in this case, the window 250 and the display panel 220 may be adhered through the adhesive layer 240.

Figure 3:
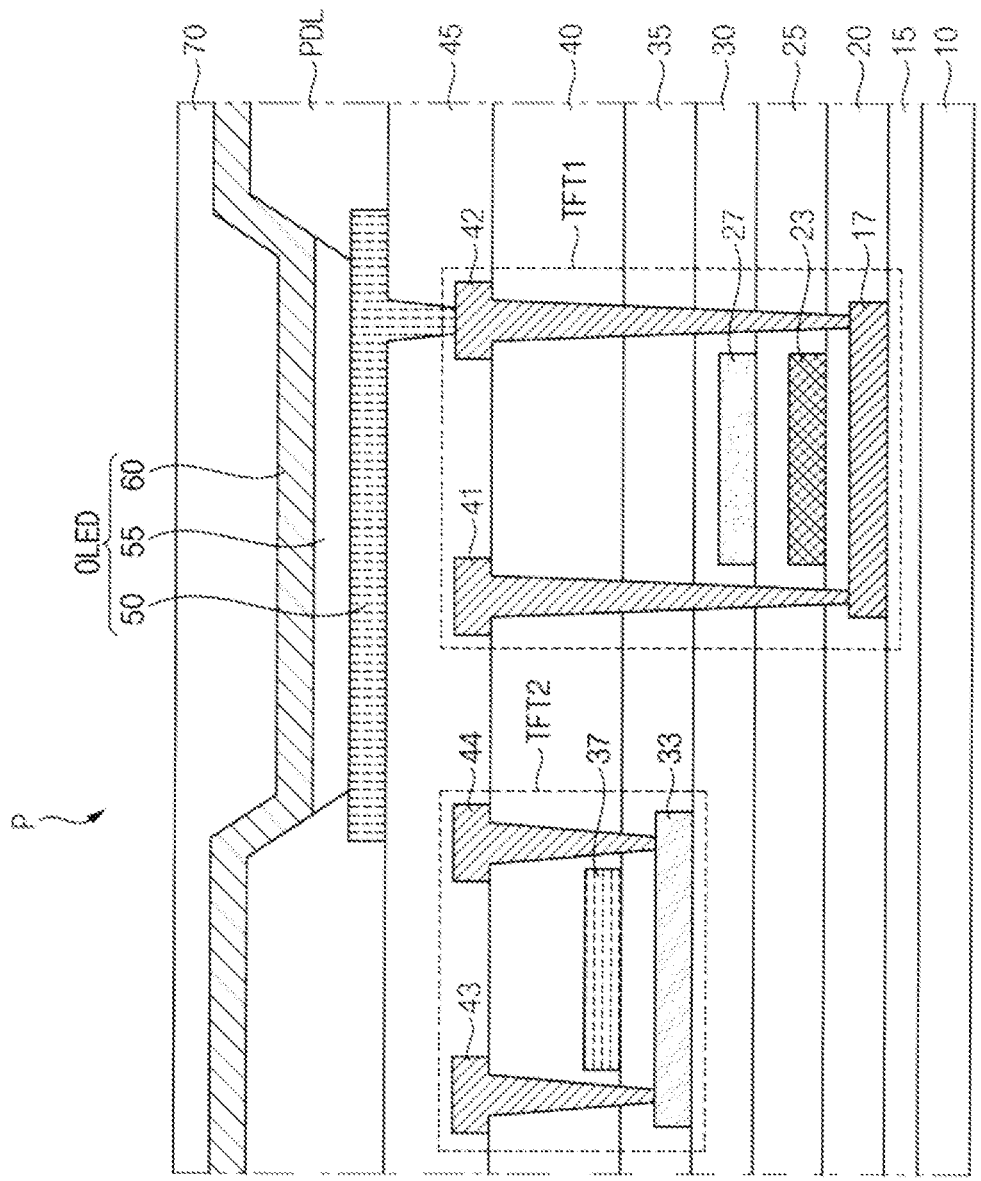
FIG. 3 is a cross-sectional view illustrating a display unit included in a display panel according to an embodiment.

The display panel 220 may include a plurality of display units (for example, display unit P of FIG. 3). Each of the plurality of display units may emit light. The display panel 220 may include a curved surface in some areas (for example, side areas SA1 and SA2, or corner area CA of FIG. 1A).

The protective element 210 may be disposed on a lower surface of the display panel 220. The protective element 210 may protect the lower surface of the display panel 220.

Figure 2:
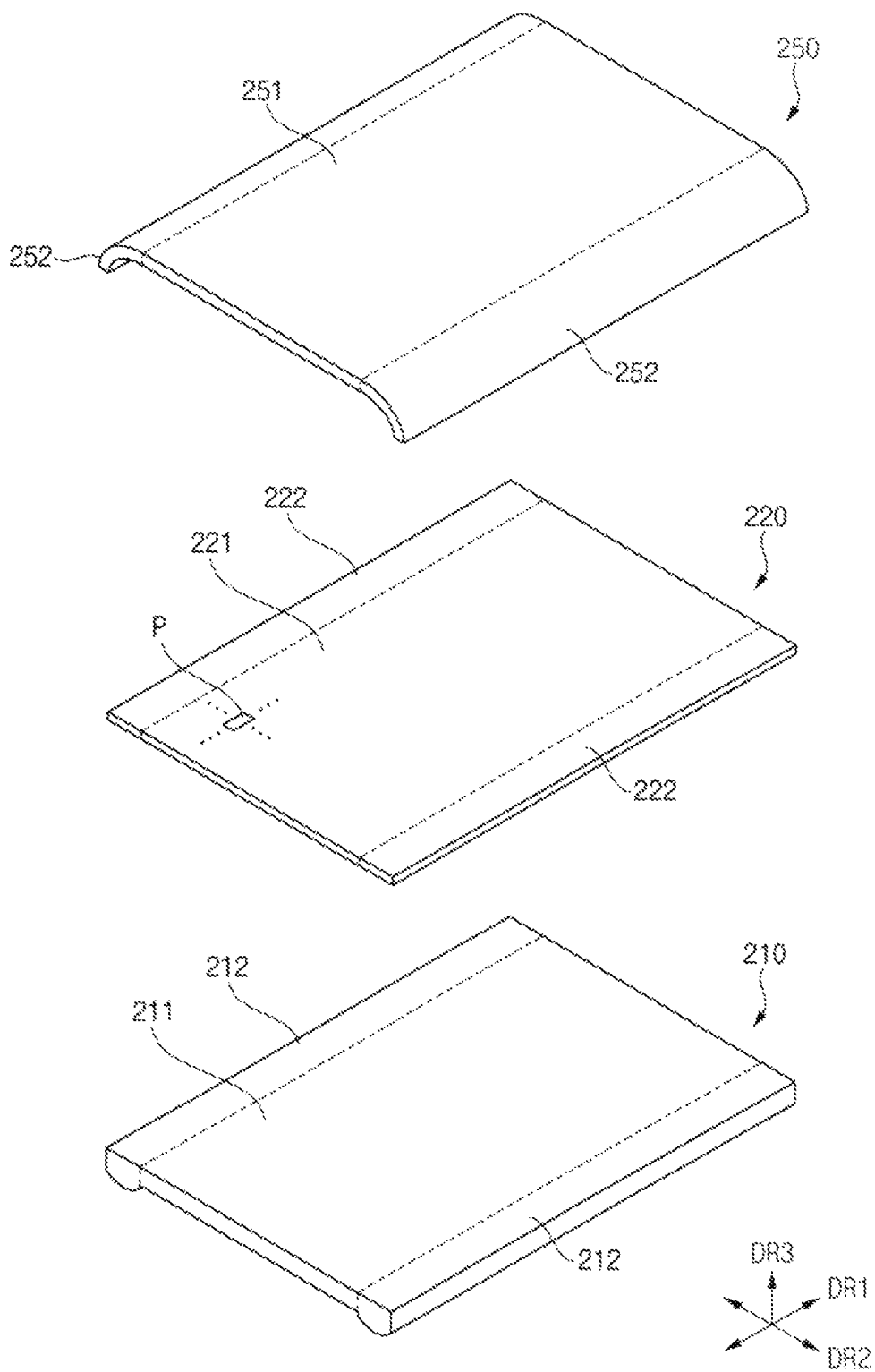
FIG. 2 is a diagram illustrating a display device according to an embodiment.

FIG. 2 is a diagram illustrating a display device according to an embodiment.

Referring to FIG. 2, a display device 1000 may include a window 250, a display panel 220, and a protective element 210 disposed under the display panel 220. The display device 1000 may include a front area (for example, front area FA of FIG. 1A), and a side area (for example, first side area SA1 of FIG. 1A).

The window 250 may transmit light emitted from the display panel 220. The window 250 may have a first surface 251 in the front area, and a second surface 252 in the side area. The first surface 251 may be a flat surface, and the second surface 252 may be a curved surface. In the side area of the window 252, a curvature of the second surface 252 may be constant. In some embodiments, the curvature of the second surface 252 may be not constant, and may be different for each location or some locations. In other embodiments, in the side area of the widow 250, the second surface 252 may have various curvatures.

The display panel 220 may be disposed under the window 250. The display panel 220 may include a plurality of display units P, and each of the plurality of display units P may emit light. When the display panel 220 is disposed under the window 250, the display panel 220 may have a flat surface in the front area, and may have a curved surface in the side area. For instance, when the display panel 220 is disposed under the window 250, a first display part 221 of the display panel may have a flat surface, and a second display part 222 positioned on both sides of the first display part 221 may have a curved surface. The second display part 222 may be disposed under the second surface 252 of the window 250.

The protective element 210 may be disposed on a lower surface of the display panel 220. The protective element 210 may protect the lower surface of the display panel. The protective element 210 may have different thicknesses in the front area and in the side area. For instance, the protective element 210 may include a first part 211 disposed on a lower surface of the first display part 221, and a second part 212 disposed on a lower surface of the second display part 222. A thickness of the first part 211 of the protective element 210 may be different from a thickness of the second part 212 of the protective element 210. The thickness of the second part 212 of the protective element 210 may not be constant. In some embodiments, a thickness (e.g., maximum thickness) of the second part 212 of the protective element 210 may be greater than a thickness (e.g., maximum thickness) of the first part 212 of the protective element 210.

FIG. 3 is a cross-sectional view illustrating a display unit included in a display panel according to an embodiment.

Referring to FIG. 3, a display unit P may include a substrate 10, a buffer layer 15, a first gate insulating layer 20, a first interlayer insulating layer 25, a second interlayer insulating layer 30, a second gate insulating layer 35, a third interlayer insulating layer 40, a via insulating layer 45, a pixel defining layer PDL, a first transistor TFT1, a second transistor TFT2, an organic light emitting diode OLED, and an encapsulation layer 70. The first transistor TFT1 may include a first active layer 17, a first gate electrode 23, a capacitance electrode 27, a first source electrode 41, and a first drain electrode 42. The second transistor TFT2 may include a second active layer 33, a second gate electrode 37, a second source electrode 43, and a second drain electrode 44. The organic light emitting diode OLED may include a lower electrode 50, a light emitting layer 55, and an upper electrode 60.

The substrate 10 may support each of the layers disposed on the substrate 10. The substrate 10 may include an insulating material, such as a polymer resin, and an inorganic material, such as a glass or quartz.

The buffer layer 15 may be disposed on the substrate 10. The buffer layer 15 may prevent impurities from penetrating into the first and second transistors TFT1 and TFT2. The buffer layer 15 may include at least one of silicon nitride, silicon oxide, and silicon oxynitride.

The first active layer 17 may be disposed on the buffer layer 15. The first active layer 17 may be (or form) a channel of the first transistor TFT1. The first active layer 17 may include a silicon-based semiconductor material.

The first gate insulating layer 20 may be disposed on the first active layer 17. The first gate insulating layer 20 may include at least one of a silicon compound, a metal oxide, etc.

The first gate electrode 23 may be disposed on the first gate insulating layer 20. The first gate electrode 23 may receive a gate signal input by a driving part. The first gate electrode 23 may include at least one of a metal, an alloy, a metal nitride, a conductive metal oxide, a transparent conductive material, etc.

The first interlayer insulating layer 25 may be disposed on the first gate electrode 23. The first interlayer insulating layer 25 may include at least one of a silicon compound, a metal oxide, etc.

The capacitance electrode 27 may be disposed on the first interlayer insulating layer 25. The capacitance electrode 27 and the first gate electrode 23 may define a capacitor.

The second interlayer insulating layer 30 may be disposed on the capacitance electrode 27. The second interlayer insulating layer 30 may include at least one of a silicon compound, a metal oxide, etc.

The second active layer 33 may be disposed on the second interlayer insulating layer 30. The second active layer 33 may be a channel of the second transistor TFT2. The second active layer 33 may include an oxide-based semiconductor material.

The second gate insulating layer 35 may be disposed on the second active layer 33. The second gate insulating layer 35 may include at least one of a silicon compound, a metal oxide, etc.

The second gate electrode 37 may be disposed on the second gate insulating layer 35. The second gate electrode 37 may receive a gate signal input by a driving part. The second gate electrode 37 may include at least one of a metal, an alloy, a metal nitride, a conductive metal oxide, a transparent conductive material, etc.

The second interlayer insulating layer 40 may be disposed on the second gate electrode 37. The second interlayer insulating layer 40 may include at least one of a silicon compound, a metal oxide, etc.

The first source electrode 41, the second source electrode 43, the first drain electrode 42, and the second drain electrode 44 may be disposed on the second interlayer insulating layer 40. The first source electrode 41 and the first drain electrode 42 may contact first active layer 17 through respective contact holes. The second source electrode 43 and the second drain electrode 44 may contact the second active layer 33 through respective contact holes. The source electrodes 41 and 43 and the drain electrodes 42 and 44 may include a conductive material, such as at least one of molybdenum (Mo), copper (Cu), aluminum (Al), and titanium (Ti).

The via insulating layer 45 may be disposed on the source electrodes 41 and 43 and the drain electrodes 42 and 44. The via insulating layer 45 may include an organic insulating material, such as polyimide (PI).

The lower electrode 50 may be disposed on the via insulating layer 45. The lower electrode 50 may contact the first drain electrode 42 through a contact hole. The lower electrode 50 may include a conductive material, such as at least one of a metal, an alloy, and a transparent conductive oxide.

The pixel defining layer PDL may be disposed on the via insulating layer 45. The pixel defining layer PDL may cover a part of the lower electrode 50. The pixel defining layer PDL may define an opening exposing an upper surface of the lower electrode 50. The pixel defining layer PDL may include an organic insulating material, such as polyimide (PI).

The light emitting layer 55 may be disposed on the lower electrode 50. The light emitting layer 55 may be disposed on the lower electrode 50 exposed by the opening in the pixel defining layer PDL. The light emitting layer 55 may include at least one of an organic light emitting material and a quantum dot.

The upper electrode 60 may be disposed on the light emitting layer 55. The upper electrode 60 may also be disposed on the pixel defining layer PDL. The upper electrode 60 may include a conductive material, such as at least one of a metal, an alloy, a transparent conductive oxide, etc. For example, the conductive material may include at least one of aluminum (Al), platinum (Pt), silver (Ag), magnesium (Mg), gold (Au), chromium (Cr), tungsten (W), titanium (Ti), etc.

The encapsulation layer 70 may be disposed on the upper electrode 60. The encapsulation layer 70 may protect the organic light emitting diode OLED, the first transistor TFT1, and the second transistor TFT2 from external moisture and/or dust.

Although an embodiment of the display unit P has been described with reference to FIG. 3, the display unit P is not limited to the structure shown in FIG. 3. For instance, the display unit P may include any structure capable of receiving an electrical signal and emitting light having a luminance corresponding to an intensity of the electrical signal.

Figure 4A:
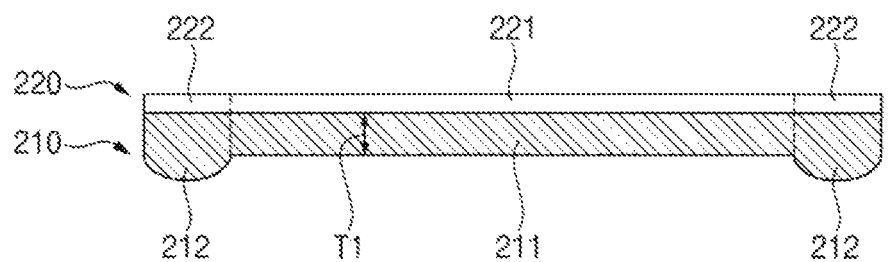
FIGS. 4A, 4B, and 4C are cross-sectional views illustrating a display device according to some embodiments.
Figure 4B:
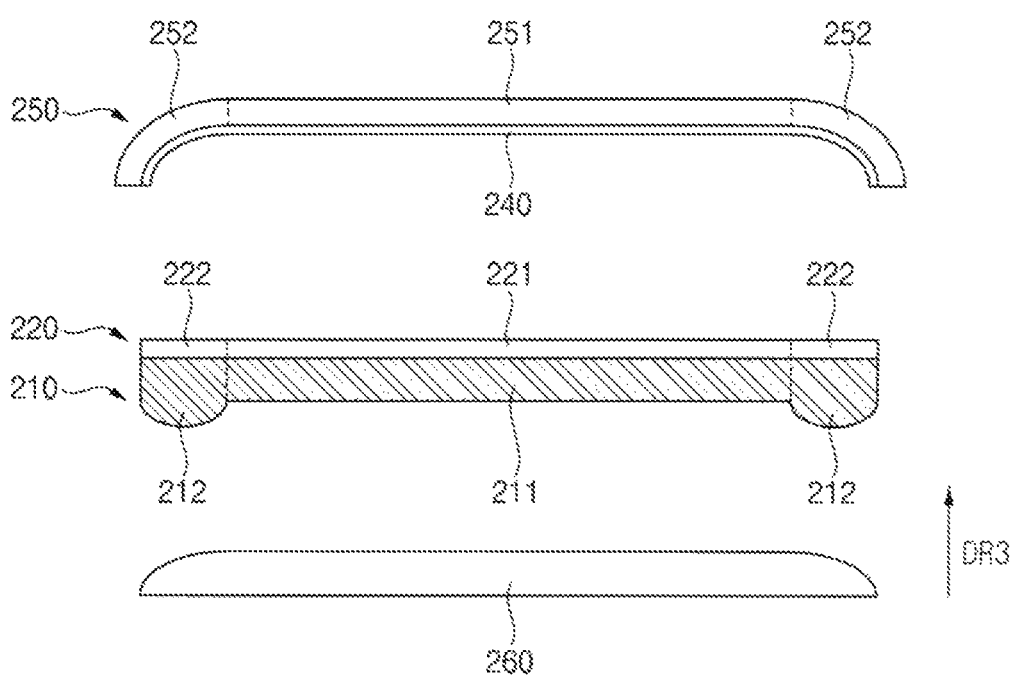
Figure 4C:
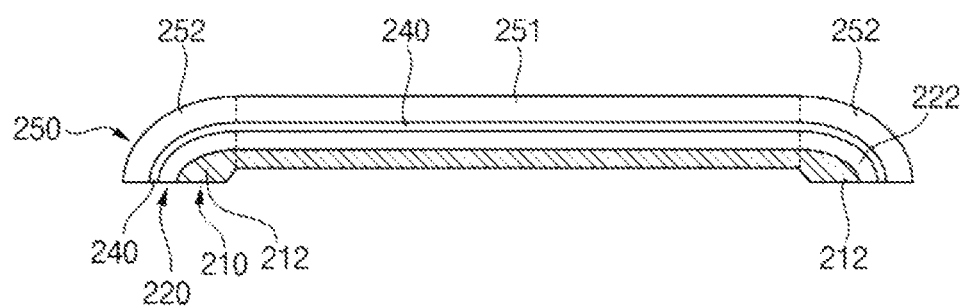

FIGS. 4A, 4B, and 4C are cross-sectional views illustrating a display device according to some embodiments.

Referring to FIG. 4A, a protective element 210 may be attached under a display panel 220. FIG. 4A may be a cross-sectional view showing the display panel 220 of FIG. 2 and the protective element 210 of FIG. 2 attached under the display panel 220. The protective element 210 may include a first part 211 attached under a first display part 221, and a second part 212 attached under a second display part 222. The first part may have a first thickness T1. A thickness of the second part 212 may be greater than the first thickness T1. The thickness of the second part 212 may not be constant. For example, the thickness of the second part 212 may be largest at the center of the second part 212, and may decrease toward at least one edge of the second part 212.

The protective element 210 may include a cured resin. For instance, the protective element 210 may include an acrylic resin or an epoxy resin. The protective element 210 may be formed via a printing method. For example, the protective element 210 may be formed by applying the cured resin to a lower surface of the display panel 220, and then repeating one or more curing processes. Accordingly, the protective element 210 may have various shapes. For example, a thickness of the protective element 210 may be different for each position where the protective element 210 is attached to the lower surface of the display panel 220.

Referring to FIG. 4B, the display panel 220 to which the protective element 210 is attached may be attached to the lower surface of the window 250. An adhesive layer 240 may be disposed on a lower surface of the window 250 to provide adhesive force.

The display panel 220 to which the protective element 210 is attached may be disposed under the window 250, and a pad 260 may be disposed under the display panel 220.

An upper surface of the pad 260 may have a substantially same shape as the lower surface of the window 250. The pad 260 may move in a third direction DR3, and the upper surface of the pad 260 may contact the protective element 210 attached under the display panel 220. The pad 260 may push the protective element 210 attached under the display panel 220 in the third direction DR3 and may press the display panel 220 and the protective element 210 in the third direction DR3. Accordingly, an upper surface of the display panel 220 may be adhered to the lower surface of the window 250 by the adhesive layer 240.

In some embodiments, the thickness of the second part 212 of the protective element 210 may be greater than the thickness of the first part 211 of the protective element 210. Accordingly, a pressure applied by the pad 260 to the second part 212 of the protective element 210 may be greater than a pressure applied by the pad 260 to the first part 211 of the protective element 210. Accordingly, when the second part 212 of the protective element 210 and the second display part 222 are bent corresponding to a curvature of the second surface 252 of the window 250, the second part 212 of the protective element 210 and the second display part 222 may be provided with sufficient pressure by the pad 260, and an empty space (for example, a bubble) between the second display part 222 and the adhesive layer 240 may not be formed.

When the thickness of the second part 212 of the protective element 210 is adjusted, the pressure applied by the pad 260 to the second part 212 of the protective element 210 may be adjusted. For example, by increasing the thickness of the second part 212, the pressure applied by the pad 260 to the second part 212 of the protective element 210 may be increased. Accordingly, when the curvature of the second surface 252 of the window 250 is relatively large, by increasing the thickness of the second part 212 of the protective element 210, the empty space may not be formed.

Referring to FIG. 4C, the display panel 220 may be attached to the lower surface of the window 250. The second display part 222 of the display panel 220 may be bent in response to the curvature of the second surface 252 of the window 250. There may be no empty space (for example, a bubble) between the second display part 222 and the adhesive layer 240.

Figure 5A:
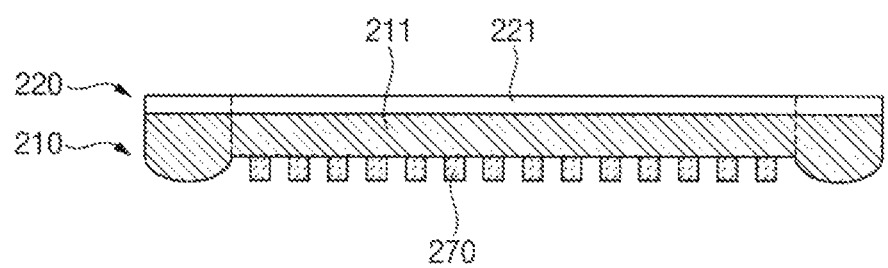
FIGS. 5A, 5B, and 5C are diagrams illustrating a display device according to some embodiments.
Figure 5B:
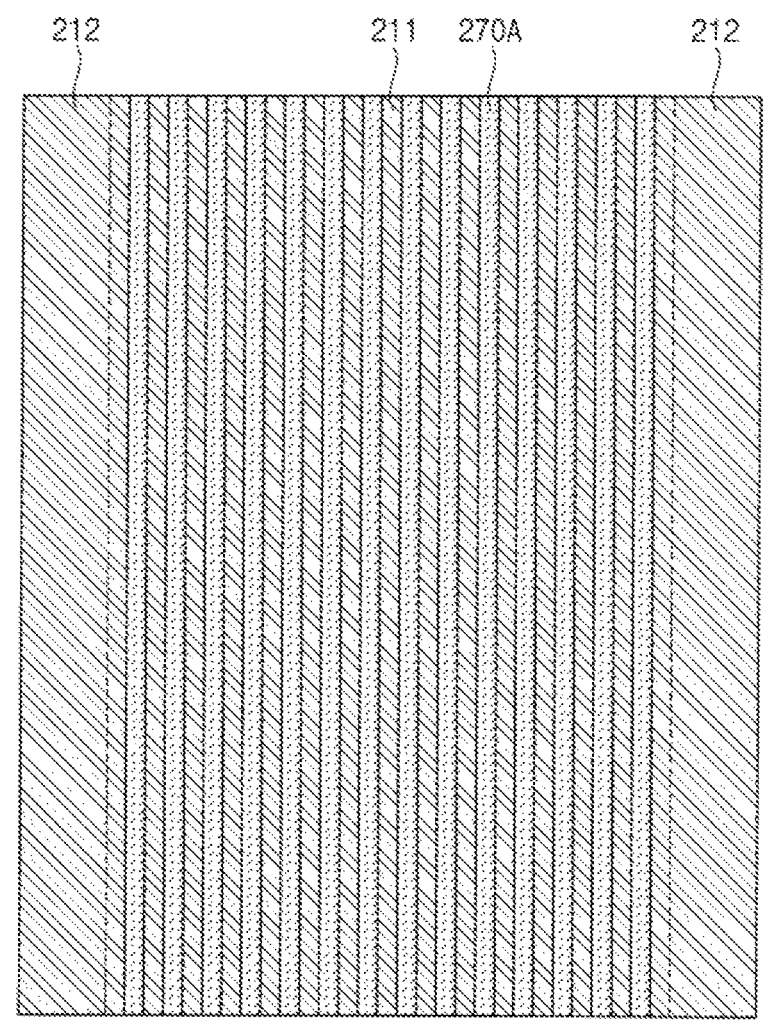
Figure 5C:
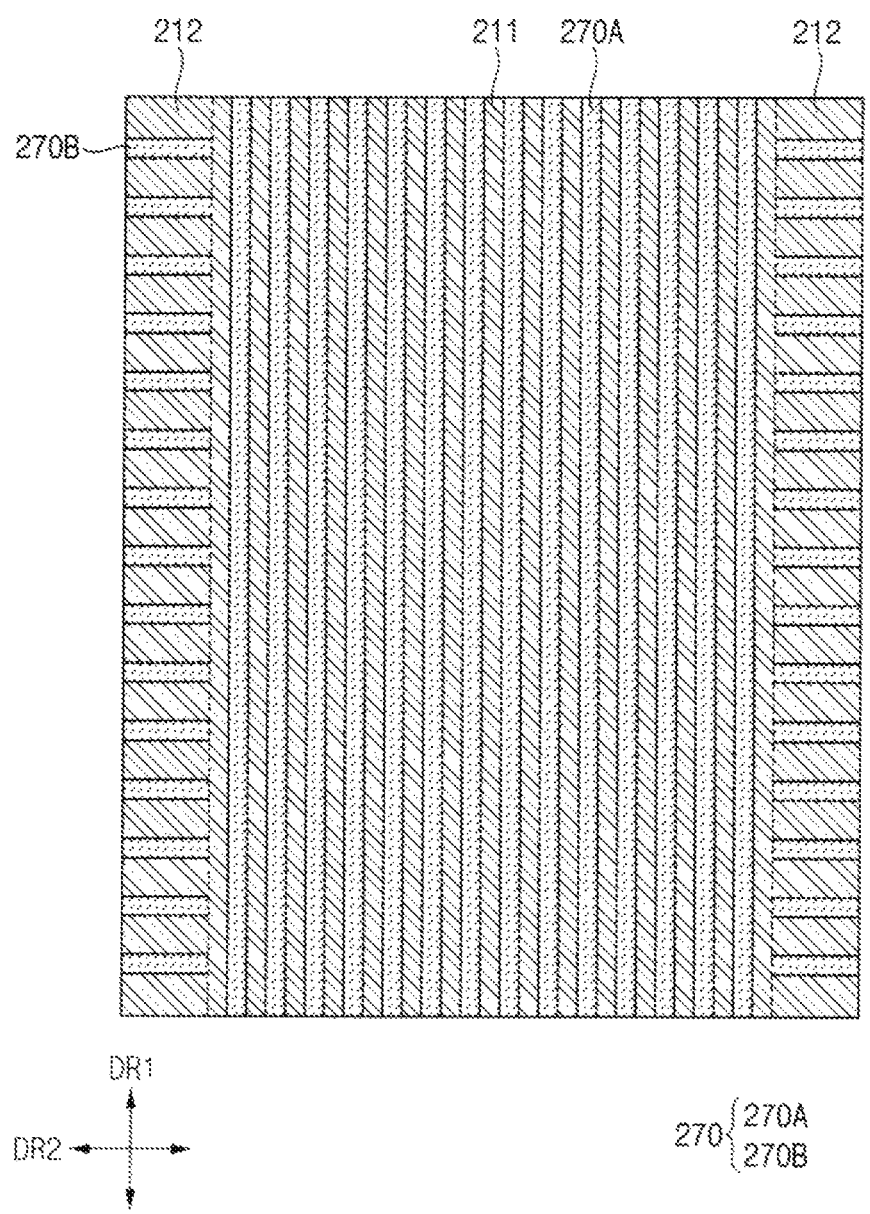

FIGS. 5A, 5B, and 5C are diagrams illustrating a display device according to some embodiments.

Referring to FIGS. 5A and 5B, the display device 1000 may further include a supporting element 270 disposed on a lower surface of the protective element 210 in (or overlapping with) the front area (for example, front area FA of FIG. 1A). For example, the supporting element 270 may disposed on a lower surface of the first part 221 of the protective element 210. A Young's modulus of the supporting element 270 may be greater than a Young's modulus of the protective element 210. The supporting element 270 may support a display panel 220 in the front area.

In some embodiments, the supporting element 270 may include first patterns 270A extending in a first direction DR1 and arranged to be spaced apart from each other in a second direction DR2. Accordingly, the first patterns 270A may prevent the display panel 220 from being bent in the first direction DR1.

In some embodiments, the supporting element 270 may further include second patterns extending in a second direction DR2 crossing the first direction DR1 and arranged to be spaced apart from each other, such as spaced apart from one another in the first direction DR1. The second patterns may be arranged to cross the first patterns 270A.

Referring to FIGS. 5A and 5C, the display device 1000 may further include a supporting element 270 disposed on a lower surface of the protective element 210 in the front area. The supporting element 270 may be disposed on a lower surface of the protective element 210 even in the side area (for example, first side area SA1 of FIG. 1A). For instance, the supporting element 270 may be disposed on a lower surface of the second part 212.

In some embodiments, the supporting element 270 disposed on the lower surface of the protective element 210 may include a third patterns 270B extending in the second direction DR2 and arranged to be spaced apart from each other, such as spaced apart from one another in the first direction DR1. The supporting element 270 disposed on the lower surface of the protective element 210 in the side area may serve to prevent formation of an empty space (for example, a bubble) between the second display part 222 and the adhesive layer 240.

According to some embodiments, the supporting element 270 disposed on the lower surface of the protective element 210 in the side area may further include fourth patterns extending in the first direction DR1 and arranged to be spaced apart from each other, such as spaced apart from one another in the second direction DR2. The fourth patterns may be arranged to cross the third patterns 270B.

A separation distance between the third patterns 270B adjacent to each other may be different from a separation distance between the first patterns 270A adjacent to each other. For example, the separation distance between the third patterns 270B adjacent to each other may be greater than the separation distance between the first patterns 270A adjacent to each other. For instance, the separation distance between the third patterns 270B adjacent to each other may be smaller than the separation distance between the first patterns 270A adjacent to each other.

Figure 6A:
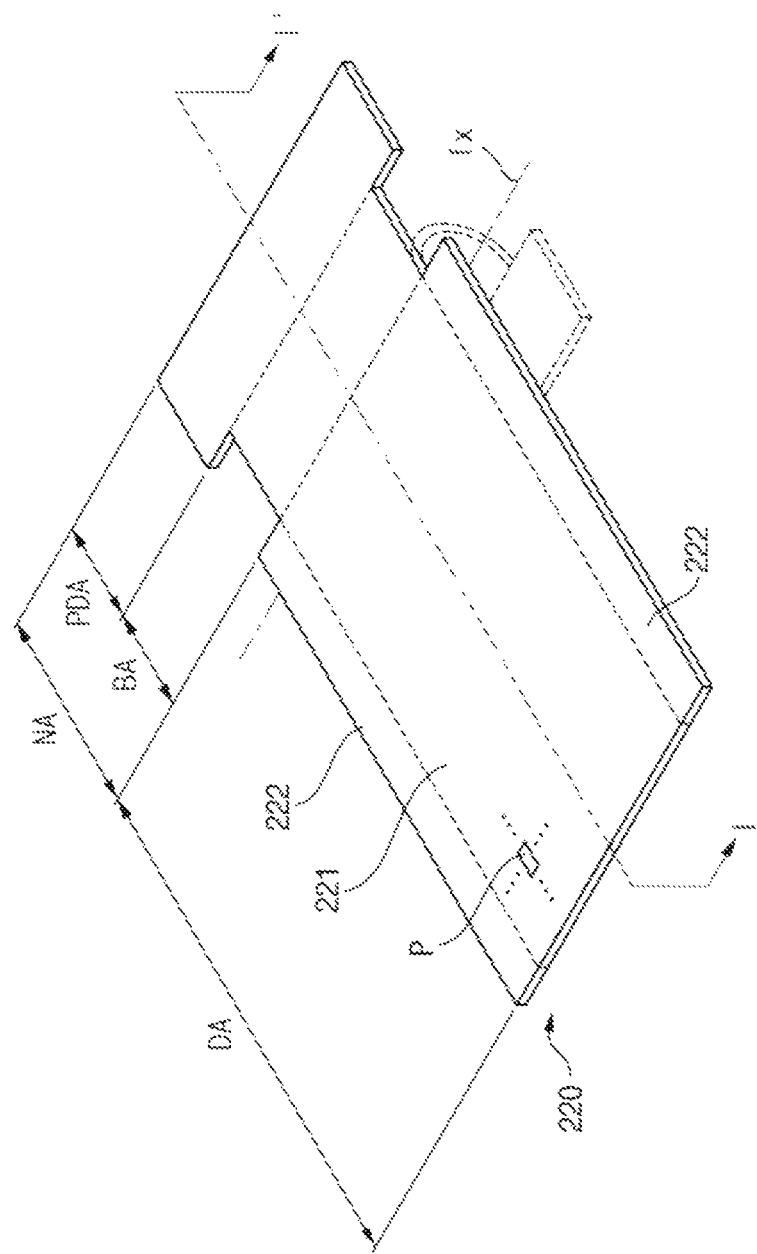
FIGS. 6A, 6B, and 6C are diagrams illustrating a display device according to some embodiments.
Figure 6B:
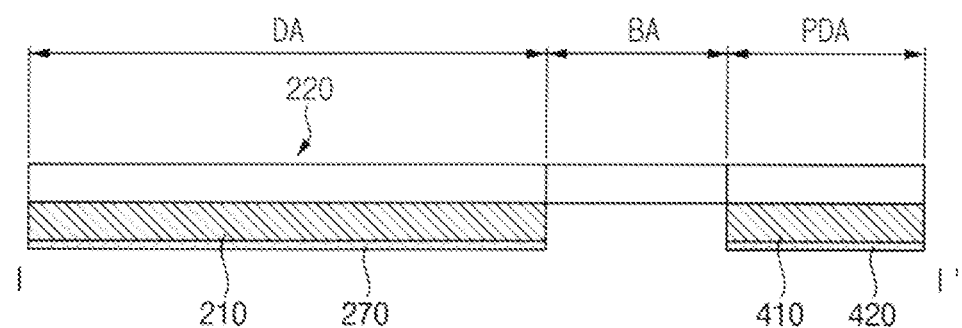
Figure 6C:
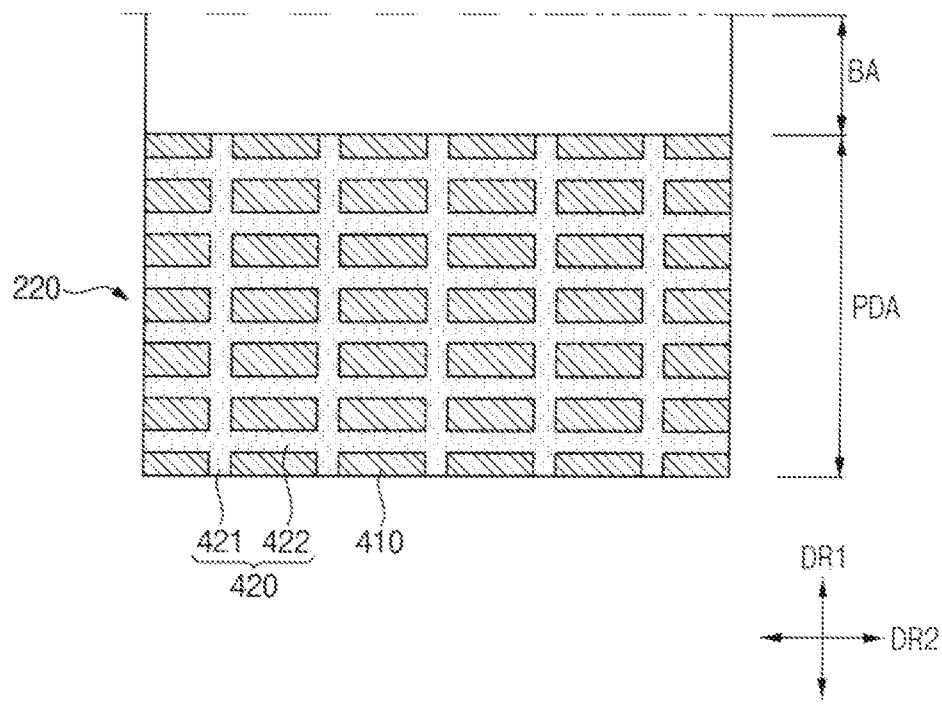

FIGS. 6A, 6B, and 6C are diagrams illustrating a display device according to an embodiment.

Referring to FIG. 6A, the display panel 220 may include a display area DA and a non-display area NA. The display area DA and the non-display area NA may be substantially the same as the display area DA and the non-display area NA described with reference to FIG. 1A. The non-display area NA may include a pad area PDA and a bending area BA positioned between the display area DA and the pad area PDA.

The display panel 220 may be bent based on a bending axis fx in the bending area BA. In FIG. 6A, a state in which the display panel 220 is not bent is illustrated by a solid line, and a state in which the display panel 220 is bent is illustrated by a dotted line. In the bending area BA, a wiring electrically connecting a driving circuit in the pad area PDA and the display unit P in the display area DA may be disposed on the display panel 220.

The display panel 220 may include the driving circuit in the pad area PDA. For example, in the pad area PDA, the driving circuit for providing an electric signal for driving the display unit P may be disposed on an upper surface of the display panel.

Referring to FIG. 6B, FIG. 6B may be a cross-sectional view taken along sectional line of FIG. 6A according to an embodiment. FIG. 6B may illustrate the state in which the display panel 220 is not bent.

In the display area DA, the protective element 210 may be disposed under the display panel 220. In some embodiments, a supporting element 270 may be disposed under the protective element 210. The supporting element 270 may be substantially same as the supporting element described with reference to FIGS. 5A, 5B, and 5C.

In the bending area BA, the protective element 210 may not be disposed under the display panel 220. Optionally, in the bending area BA, the protective element 210 may be disposed under the display panel 220.

In the pad area PDA, a pad protective element 410 may be disposed under the display panel 220. The pad protective element 410 may protect a lower surface of the display panel 220. The pad protective element 410 may include a cured resin. For instance, the pad protective element 410 may include an acrylic resin or an epoxy resin. The pad protective element 410 may be formed via a printing method.

A pad supporting element 420 may be disposed under the pad protective element 410. The pad supporting element 420 may support the display panel 220 in the pad area PDA, and may prevent deformation of the display panel 220. A Young's modulus of the pad supporting element 420 may be larger than a Young's modulus of the pad protective element 410.

Referring to FIG. 6C, FIG. 6C may be a plan view illustrating the pad supporting element 420 disposed under the pad protective element 410. The pad supporting element 420 may be disposed to form a pattern.

In some embodiments, the pad supporting element 420 may include first patterns 421 extending in a first direction DR1 and arranged to be spaced apart from each other, and second patterns 422 extending in a second direction DR2 crossing the first direction DR1 and arranged to be spaced apart from each other. The first and second patterns 421 and 422 may be formed via a printing method. Accordingly, a density of each of the first and second patterns 421 and 422 may be adjusted. For example, when a separation distance between the first patterns 421 is relatively small, the density of the first patterns 421 may be relatively increased.

Figure 7:
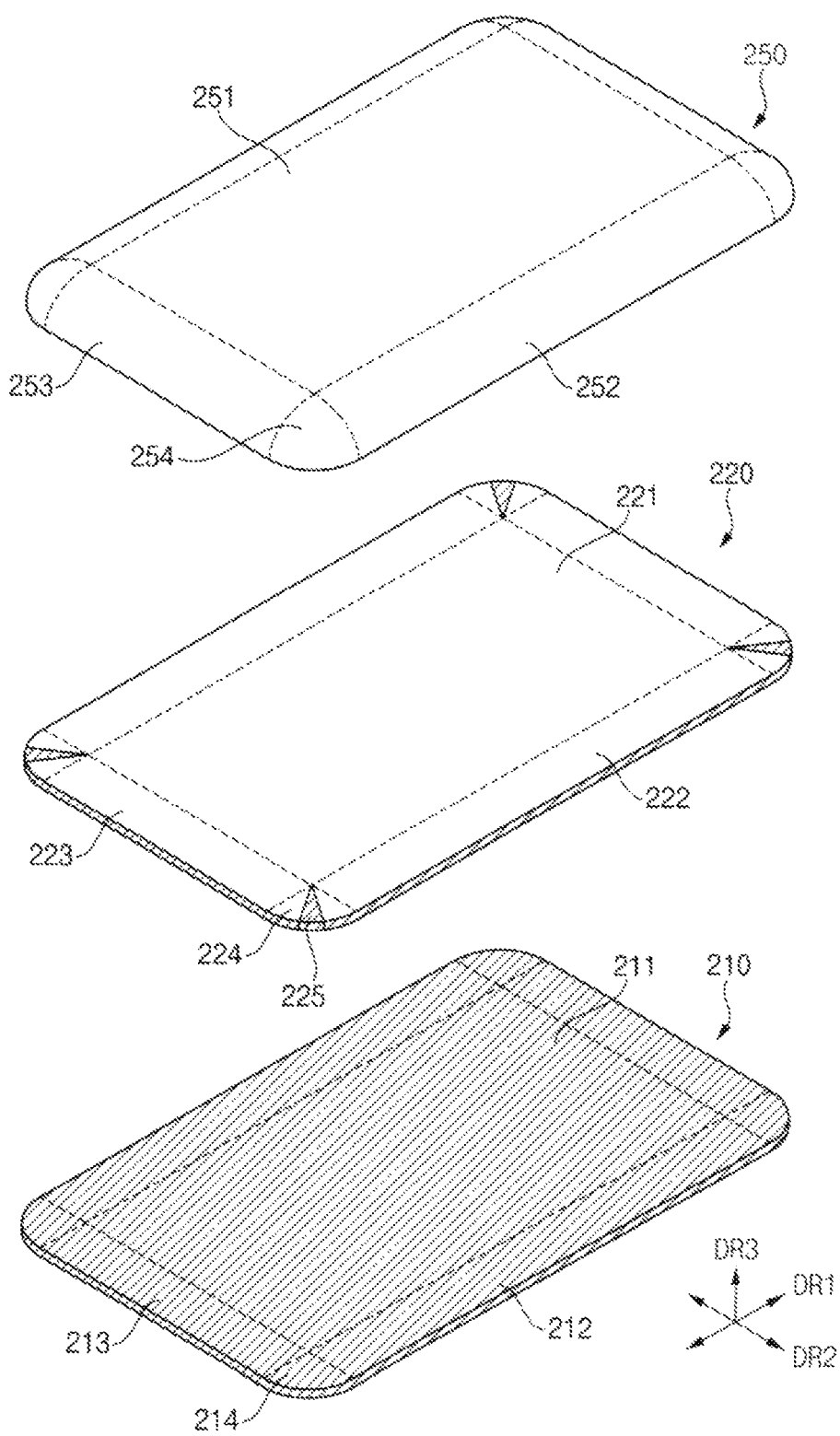
FIG. 7 is a diagram illustrating a display device according to an embodiment.

FIG. 7 is a diagram illustrating a display device according to an embodiment.

Referring to FIG. 7, a display device 1000 may include a window 250, a display panel 220, and a protective element 210 attached to a lower surface of the display panel 220. The display device 1000 may include a front area (for example, front area FA of FIG. 1A), a side areas (for example, first and second side areas SA1 and SA2 of FIG. 1A) located around the front area, and a corner area (for example, corner area CA of FIG. 1A) located between two adjacent side areas among the side areas.

The window 250 may transmit light emitted from the display panel 220. The window 250 may include a first surface 251 in (or overlapping with) the front area, and second and third surfaces 252 and 253 in (or overlapping with) the side areas. The window 250 may include a fourth surface 254 in (or overlapping with) the corner area. The first surface 251 may be a flat surface, and each of the second, third, and fourth surfaces 252, 253, and 254 may be a curved surface.

The display panel 220 may be disposed under the window 250. The display panel 220 may include a plurality of display units P, and each of the plurality of display units P may emit light. When the display panel 220 is disposed under the window 250, the display panel 220 may have a flat surface in the front area, and may have a curved surface in the side and corner areas. For example, when the display panel 220 is disposed under the window 250, a first display part 221 of the display panel 220 may have a flat surface, and second and third display parts 222 and 223 of the display panel 220 may have a curved surface. A fourth display part 224 of the display panel 220 may have a curved surface. The second display part 222 of the display panel 220 may be disposed under the second surface 252, and the third display part 223 of the display panel 220 may be disposed under the third surface 253. The fourth display part 224 of the display panel 220 may be disposed under the fourth surface 254.

The display panel 220 may include a groove 225 in the corner area. The groove 225 may have a shape recessed into the display panel 220. The protective element 210 may be filled in the groove 225.

The protective element 210 may be disposed under the display panel 220. The protective element 210 may protect a lower surface of the display panel 220. The protective element 210 may include a first part 211 disposed under the first display part 221, a second part 212 disposed under the second display part 222, a third part 213 disposed under the third display part 223, and a fourth part 214 disposed under the fourth display part 224. A thickness of the protective element 210 may not be constant in one or more of (e.g., each of) the first part 211, the second part 212, the third part 213, and the fourth part 214.

Figure 8A:
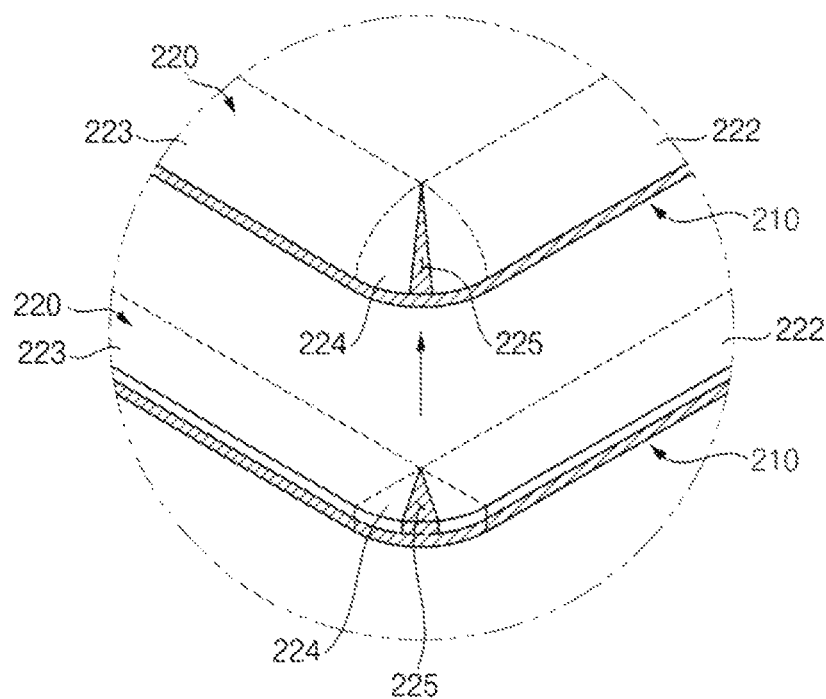
FIGS. 8A and 8B are diagrams illustrating a groove included in a display device according to an embodiment.
Figure 8B:
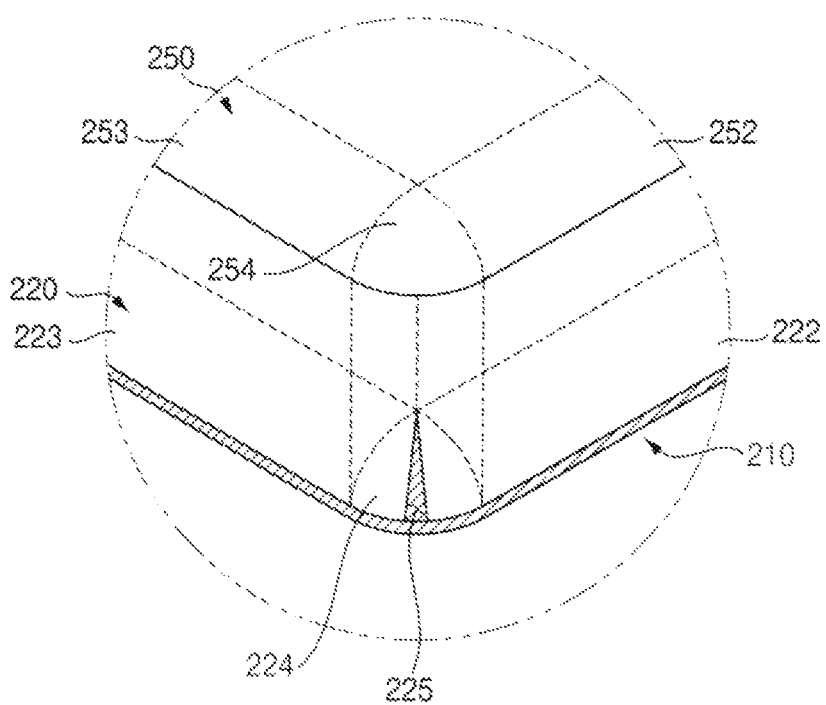

FIGS. 8A and 8B are diagrams illustrating a groove included in the display device according to some embodiments.

In FIGS. 8A and 8B, although the display panel 220 having only one groove 225 in the corner area is illustrated, the number of the groove 225 is not limited thereto. For example, there may be a plurality of grooves 225 in the corner area.

Referring to FIGS. 8A and 8B, the protective element 210 may be attached to a lower surface of the display panel 220. The fourth display part 224 of the display panel 220 may include the groove 225. For instance, the display panel 220 may include a groove 225 in the corner area (for example, corner area CA of FIG. 1A). The groove 225 may have a shape recessed into the display panel 220. The protective element 210 may be filled in the groove 225. In some embodiments, an inner space of the groove 225 may be completely filled with the protective element 210.

In the absence of the groove 225, when the display panel 220 is attached to the window 250, buckling may occur in the corner area. For instance, the display panel 220 may be deformed in the corner area, and the display quality of the display device 1000 may be deteriorated.

The protective element 210 filling the groove 225 may be stretched and/or contracted. Accordingly, when the display panel 220 is attached to the window 250, the protective element 210 filled in the groove 225 may contract, and the display panel 220 may have a curved surface in the corner area.

When the inner space of the groove 225 is filled with the protective element 210, when the display panel 220 is attached to the window 250, wrinkling may not occur in the corner area. When the inner space of the groove 225 is not filled with the protective element 210, when the display panel 220 is attached to the window 250, wrinkling may occur in the corner area.

In some embodiments, a Young's modulus of the protective element 210 may be smaller than a Young's modulus of polyethylene terephthalate (PET). For example, the Young's modulus of the protective element 210 may be about 250 MPa or less. When the Young's modulus of the protective element 210 is equal to or greater than the Young's modulus of PET, when the display panel 220 is attached to the window 250, a crack may occur in the protective element 210 in the corner area.

Figure 9:
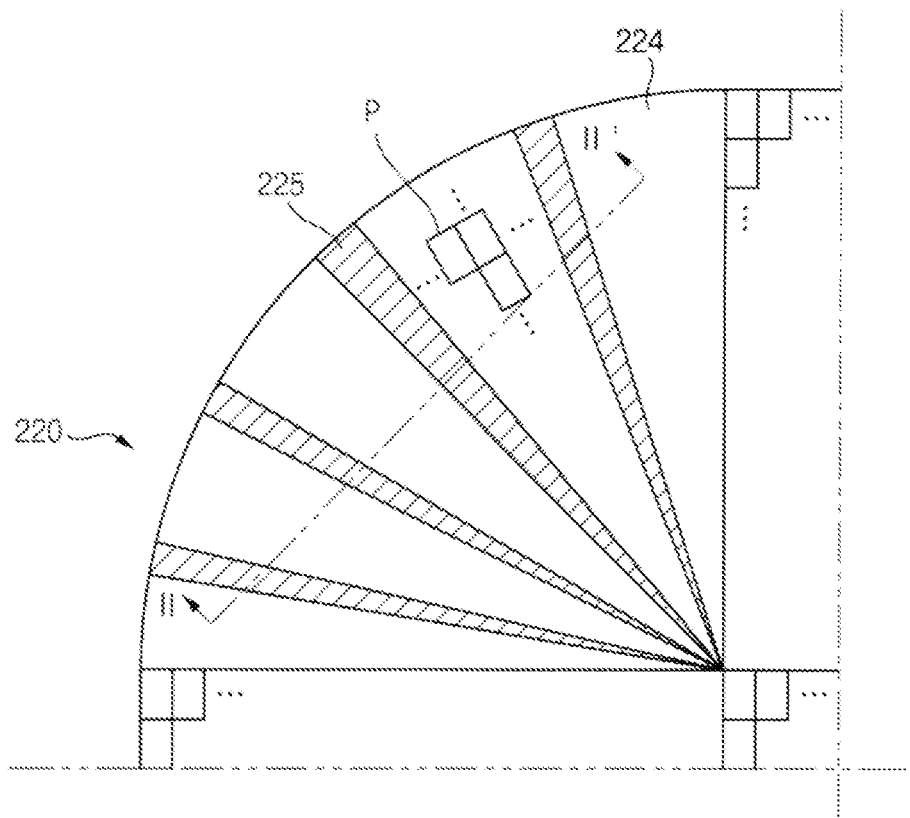
FIG. 9 is a plan view illustrating a corner area of a display device according to an embodiment.

FIG. 9 is a plan view illustrating a corner area of a display device according to an embodiment.

The display panel 220 may include a plurality of grooves 225 in the corner area (for example, corner area CA of FIG. 1A). The display panel 220 may include display units P emitting light. Each of the display units P may be the display unit P described with reference to FIG. 3. The grooves 225 may not have display units P. For instance, the groove 225 may not emit light. Each of the grooves 225 may be filled with the protective element 210.

The protective element 210 may include a cured resin. For example, the protective element 210 may include an acrylic resin or an epoxy resin. The protective element 210 may be formed via a printing method. For instance, the protective element 210 may be formed by applying the cured resin to a lower surface of the display panel 220 and then repeating the curing process. Accordingly, the protective element 210 may have various shapes.

Figure 10:
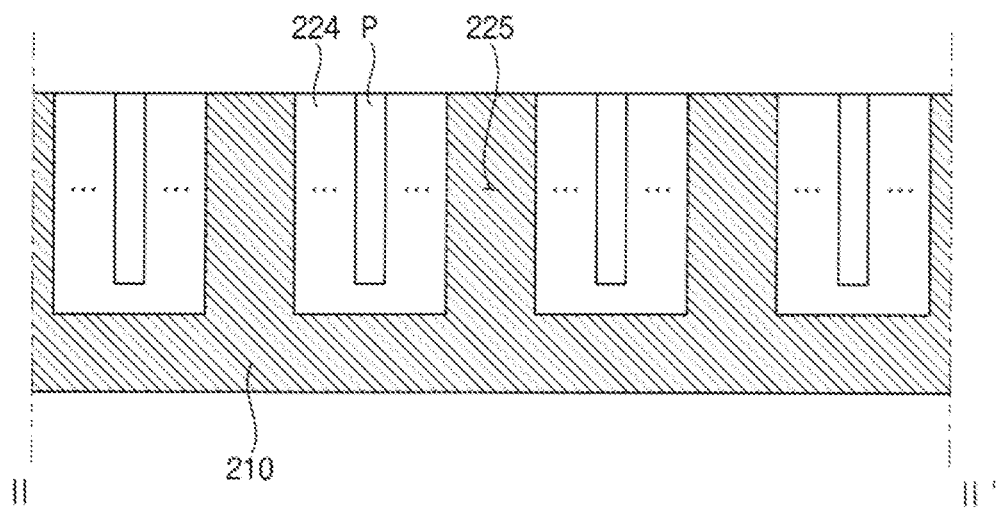
FIG. 10 is a cross-sectional view taken along sectional line II-II' of FIG. 9 according to an embodiment.

FIG. 10 is a cross-sectional view taken along sectional line II-If of FIG. 9 according to an embodiment.

Referring to FIG. 10, the display panel 220 may include the plurality of grooves 225. The display panel 220 may include the display units P. The grooves 225 may not include the display units P. The grooves 225 may be filled with the protective element 210. For example, a side surface of the display panel 224 defined including the grooves 225 may contact the protective element 210 filled in the grooves 225. In some embodiments, the grooves 225 may extend radially from a vertex of first display part 221 of the display panel 220.

Figure 11A:
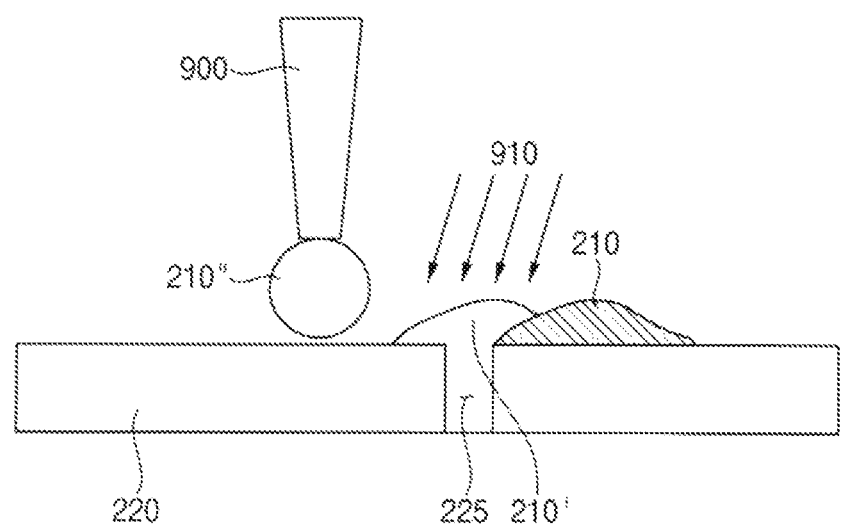
FIGS. 11A and 11B are diagrams illustrating a protective element filled in the groove of FIG. 10 according to some embodiments.
Figure 11B:
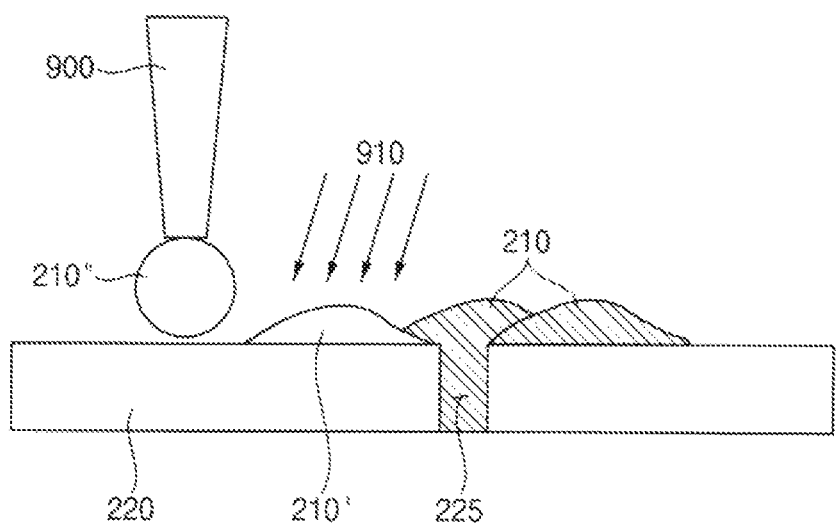

FIGS. 11A and 11B are diagrams illustrating a protective element filled in the groove of FIG. 10 according to some embodiments.

Referring to FIGS. 11A and 11B, the protective element 210 may be formed through repeated printing and curing processes. The protective element 210 may be formed via a printing method. The protective element 210 may include a cured resin. The cured resin may include an epoxy resin or an acrylic resin cured by light or heat.

Referring to FIG. 11A, resin droplet 210" may be supplied to a lower surface of a display panel 220 in an uncured state through a printer 900. The resin droplet 210" may be supplied to an area adjacent to resin 210'.

The resin 210' may be applied to the lower surface of the display panel 220 to have a fixed shape according to a shape of the lower surface of the display panel 220. For example, the resin 210' may be filled in a groove 225. The resin 210' may receive energy 910. The energy 910 may be light or heat, and may cure the resin 210'.

Referring to FIG. 11B, the resin 210' of FIG. 11A may be cured to become the protective element 210 of FIG. 11B. In addition, the resin droplet 210" of FIG. 11A may become the resin 210' of FIG. 11B, and may be applied to the lower surface of the display panel 220 to have a fixed shape. Accordingly, the protective element 210 may have various shapes (for example, the protective element 210 of FIG. 4A). In addition, the protective element 210 may be filled in the groove 225.

Figure 12A:
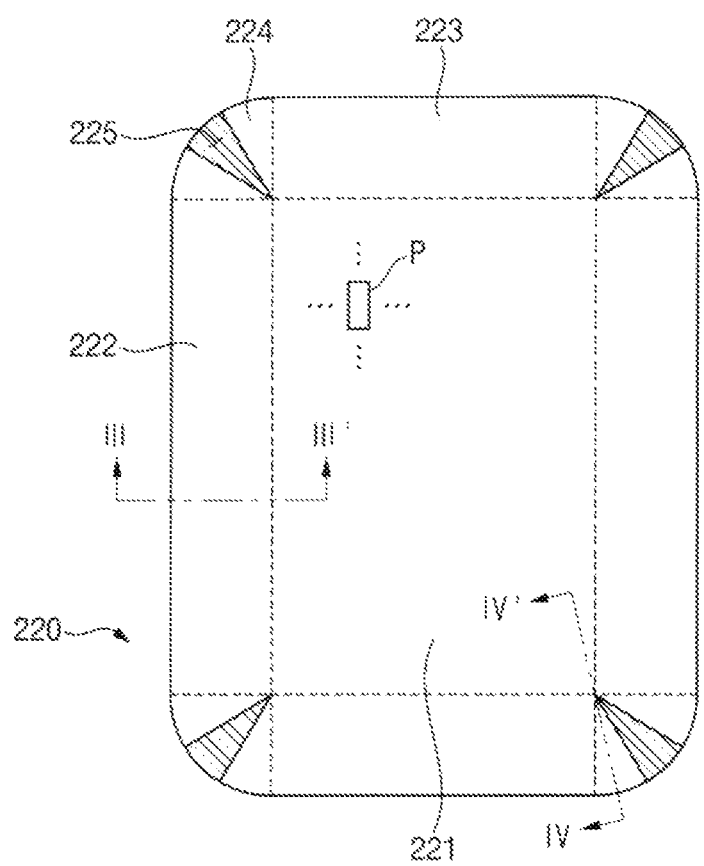
FIGS. 12A and 12B are plan views illustrating a display panel and a protective element included in a display device according to some embodiments.
Figure 12B:
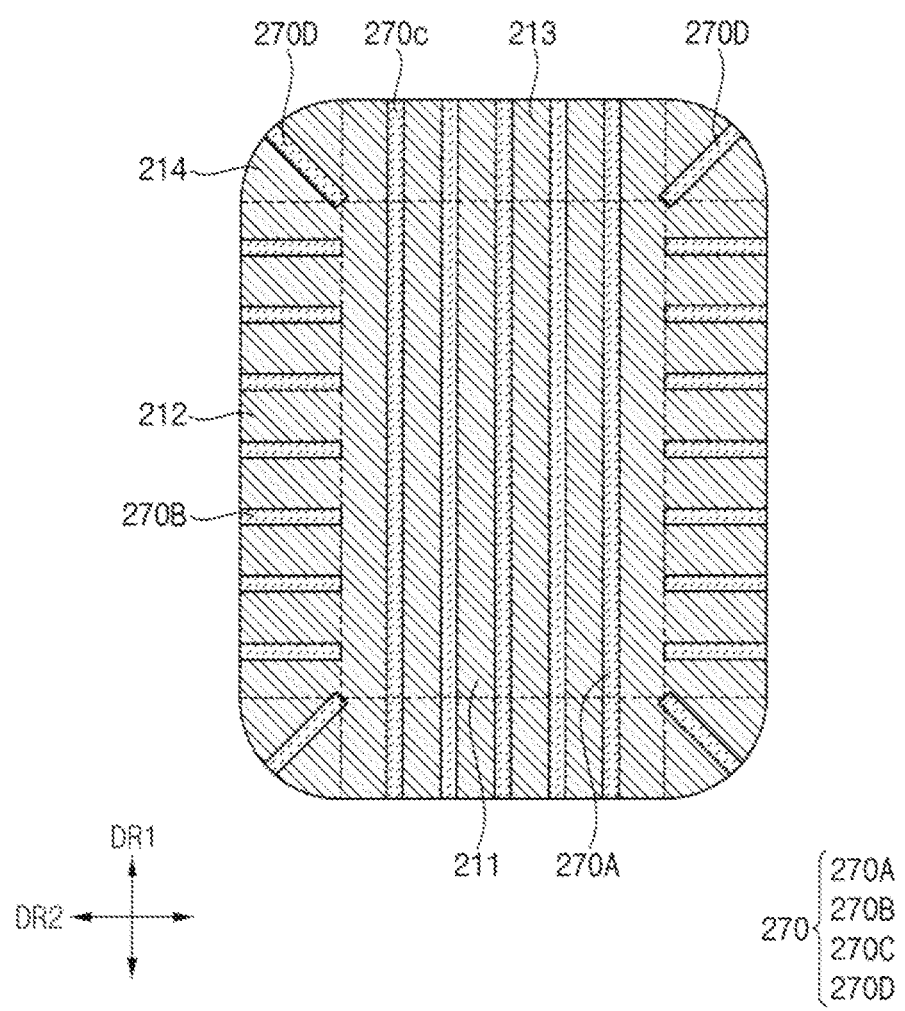

FIGS. 12A and 12B are plan views illustrating a display panel and a protective element included in a display device according to some embodiments.

Referring to FIG. 12A, the display panel 220 may include the first display part 221, the second display part 222, the third display part 223, and the fourth display part 224. The display panel 220 may include the plurality of display units P such that the display panel 220 may display an image. The display panel 220 may include groove 225 in the corner area (for example, corner area CA of FIG. 1A). For instance, the fourth display part 224 of the display panel 220 may include the groove 225. A protective element 210 may fill an inner space of the groove 225. The groove 225 may not include the display unit P. The protective element 210 may be disposed on a lower surface of the display panel 220.

Referring to FIG. 12B, a supporting element 270 may be disposed under the display panel 220.

In the front area (for example, front area FA of FIG. 1A), the supporting element 270 may be disposed on a lower surface of the protective element 210 disposed on the lower surface of the display panel 220. For instance, the supporting element 270 may be disposed on a lower surface of the first part 211 of the protective element 210.

The supporting element 270 may include first patterns 270A disposed on a lower surface of the protective element 210 in the first area. The first patterns 270A may extend in the first direction DR1 and may be arranged to be spaced apart from each other, such as spaced apart from one another in the second direction DR2.

In the first side area (for example, first side area SA1 of FIG. 1A), the supporting element 270 may be disposed on the lower surface of the protective element 210 disposed on the lower surface of the display panel 220. For example, the supporting element 270 may be disposed on a lower surface of the second part 212 of the protective element 210.

The supporting element 270 may include second patterns 270B disposed on the lower surface of the protective element 210. The second patterns 270B may extend in the second direction DR2 and may be arranged to be spaced apart from each other, such as spaced apart from one another in the first direction DR1.

In the second side area (for example, second side area SA2 of FIG. 1A), the supporting element 270 may be disposed on the lower surface of the protective element 210 disposed on the lower surface of the display panel 220. For instance, the supporting element 270 may be disposed on a lower surface of the third part 213 of the protective element 210.

The supporting element 270 may include third patterns 270C disposed on the lower surface of the protective element 210. The third patterns 270C may extend in the first direction DR1 and may be arranged to be spaced apart from each other, such as spaced apart from one another in the second direction DR2.

In the corner area (for example, corner area CA of FIG. 1A), the supporting element 270 may be disposed on the lower surface of the protective element 210 disposed on the lower surface of the display panel 220. For instance, the supporting element 270 may be disposed on a lower surface of the fourth part 214 of the protective element 210.

The supporting element 270 may include fourth patterns 270D disposed on the lower surface of the protective element 210. The fourth patterns 270D may extend in a direction away from the first part 211 of the protective element 210 in a plan view, such as direction crossing each of the first and second directions DR1 and DR2, e.g., a radial direction from a vertex of the first part 211 of the protective element 210. Although FIG. 12B illustrates an embodiment including four fourth patterns 270D, the number of the fourth patterns 270D is not limited thereto. For example, the supporting element 270 may include a plurality of fourth patterns 270D in one or more of the fourth parts 214 of the protective element 210.

A separation distance between the first patterns 270A adjacent to each other may be different from a separation distance between the second patterns 270B adjacent to each other. The separation distance between the first patterns 270A adjacent to each other may be different from a separation distance between the third patterns 270C. The separation distance between the second patterns 270B adjacent to each other may be different from the separation distance between the third patterns 270C.

Figure 13:
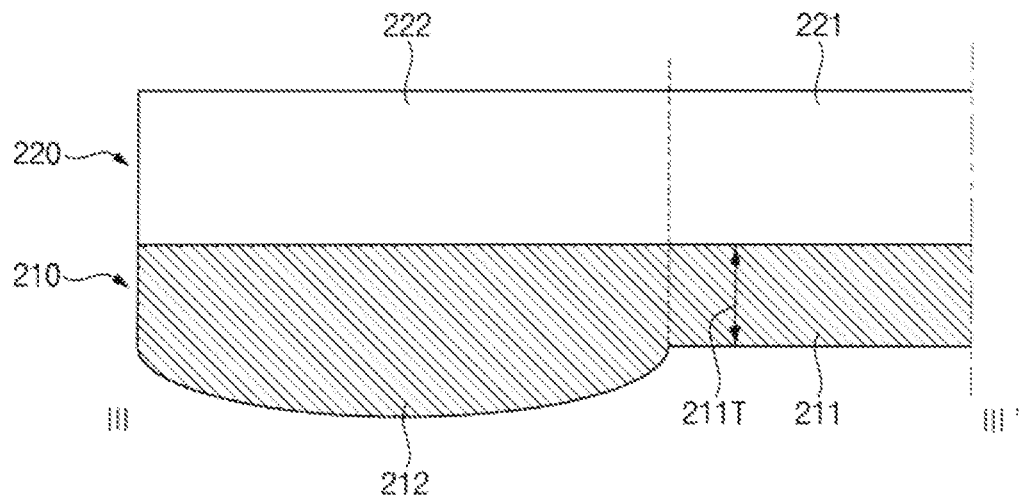
FIG. 13 is a cross-sectional view taken along sectional line of III-III' FIG. 12A according to an embodiment.

FIG. 13 is a cross-sectional view taken along sectional line of FIG. 12A according to an embodiment.

Referring to FIG. 13, a thickness of the protective element 210 disposed on a lower surface of a display panel 220 in the first side area (for example, first side area SA1 of FIG. 1A) may be greater than a thickness of the protective element 210 disposed on a lower surface of the display panel 220 in the front area (for example, front area FA of FIG. 1A). For example, a thickness of the second part 212 of the protective element 210 may be greater than a thickness 211T of the first part 211 of the protective element 210.

The thickness of the second part 212 may not be constant. For example, the thickness of the second part 212 may be greatest at a center of the second part 212 and may decrease toward at least one edge of the second part 212.

In some embodiments, a thickness of the protective element 210 disposed on a lower surface of the display panel 220 in the second side area (for example, second side area SA2 of FIG. 1A) may be greater than the thickness 211T of the protective element 210 disposed on the lower surface of the display panel 220 in the front area. For example, a thickness of the third part (213 of FIG. 7) of the protective element 210 may be greater than the thickness 211T of the first part 211 of the protective element 210.

The thickness of the third part 213 may not be constant. The thickness of the third part 213 may be greatest at a center of the third part 213 and may decrease toward at least one edge of the third part 213.

Accordingly, when the display panel 220 forms a curved surface in the side areas (for example, first and side areas SA1 and SA2 of FIG. 1A) and is attached to a window (250 of FIG. 7), an empty space (for example, bubbles) may not be formed.

Figure 14:
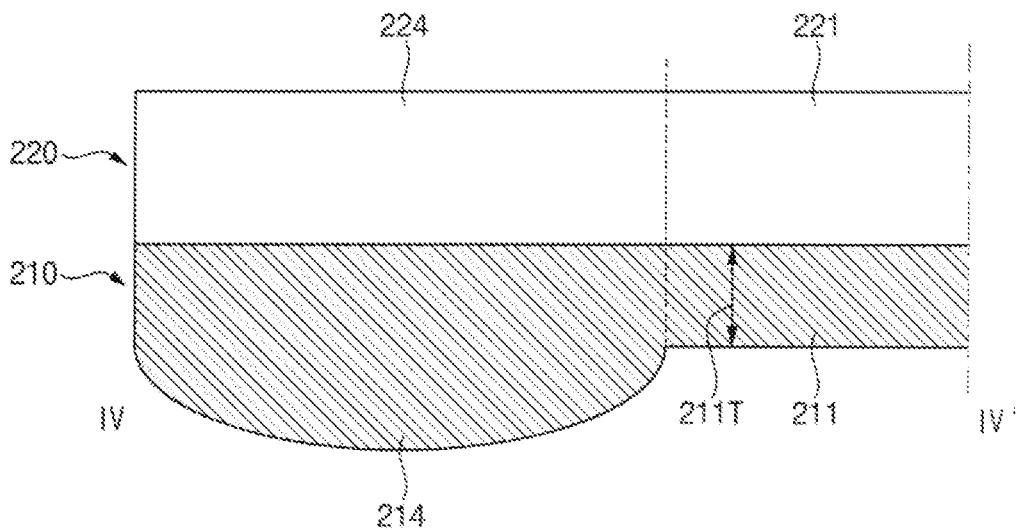
FIG. 14 is a cross-sectional view taken along sectional line IV-IV' of FIG. 12A according to an embodiment.

FIG. 14 is a cross-sectional view taken along sectional line IV-IV' of FIG. 12A according to an embodiment.

Referring to FIG. 14, a thickness of the protective element 210 disposed on a lower surface of the display panel 220 in the corner area (for example, corner area CA of FIG. 1A) may be greater than a thickness of the protective element 210 disposed on a lower surface of the display panel 220 in the front area (for example, front area FA of FIG. 1A). For example, a thickness of the fourth part 214 of the protective element 210 may be greater than a thickness 211T of the first part of the protective element 210.

The thickness of the fourth part 214 may not be constant. For example, the thickness of the fourth part 214 may be greatest at a center of the fourth part 214 and may decrease toward at least one edge of the fourth part 214.

Accordingly, when the display panel 220 forms a curved surface in the corner area and is attached to the window (250 of FIG. 7), an empty space (for example, bubbles) may not be formed.

Figure 15:
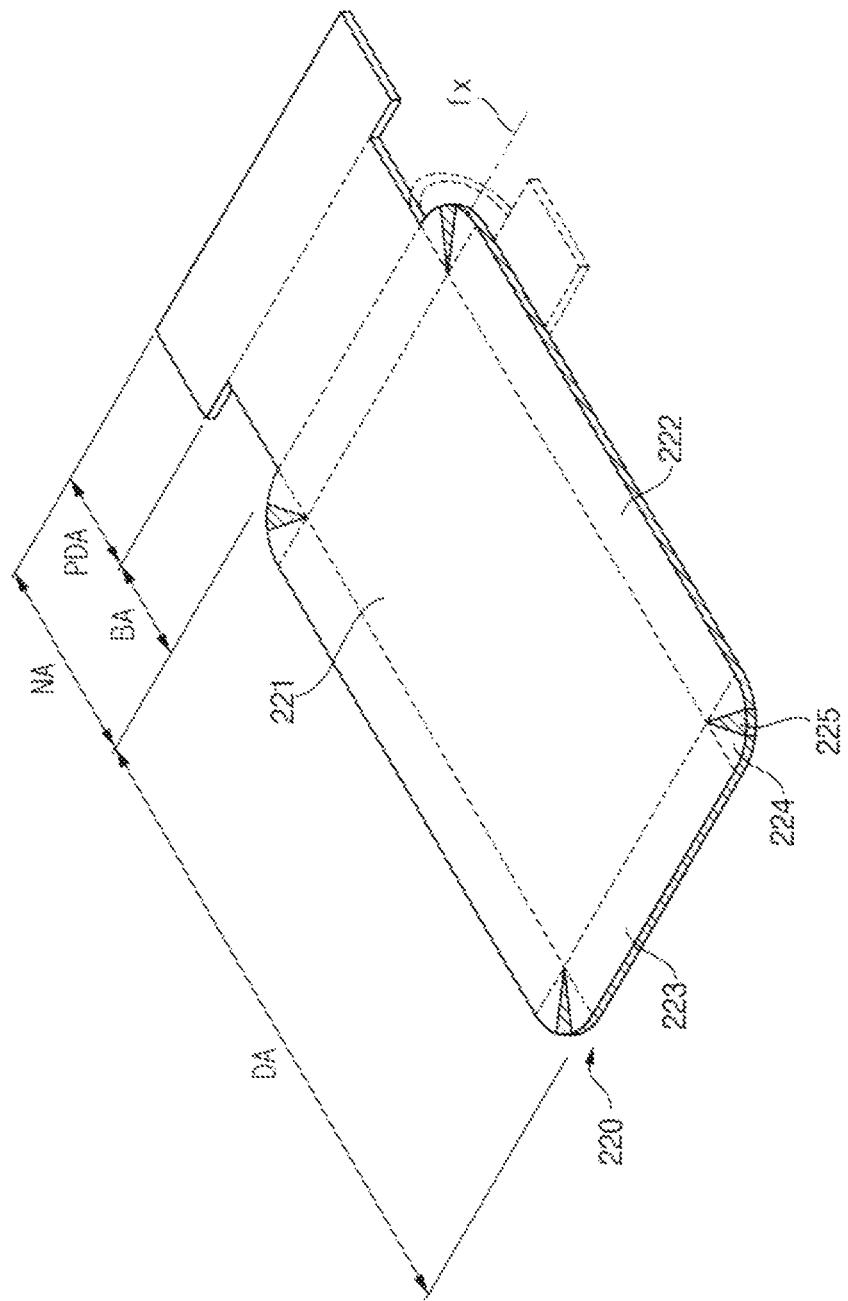
FIG. 15 is a diagram illustrating a display device according to an embodiment.

FIG. 15 is a diagram illustrating a display device according to an embodiment.

Referring to FIG. 15, the display panel 220 may include a display area DA and a non-display area NA. The display area DA and the non-display area NA may be substantially the same as the display area DA and the non-display area NA described with reference to FIG. 1A. The non-display area NA may include a pad area PDA and a bending area BA positioned between the display area DA and the pad area PDA.

The display panel 220 may be bent based on a bending axis fx in the bending area BA. In FIG. 15, a state in which the display panel 220 is not bent is illustrated by a solid line, and a state in which the display panel 220 is bent is illustrated by a dotted line. In the bending area BA, a wire electrically connecting a driving circuit on the pad area PDA and the display unit P on the display area DA may be disposed on the display panel 220.

The display panel 220 may include a driving circuit in the pad area PDA. For example, in the pad area PDA, the driving circuit for providing an electric signal for driving a display unit P may be disposed on an upper surface of the display panel 220.

In some embodiments, a pad protective element (for example, 410 of FIG. 6B) may be disposed on a lower surface of the display panel 220 in the pad area PDA. The pad protective element may protect the lower surface of the display panel 220 in the pad area PDA. In an embodiment, a pad supporting element (for example, 420 of FIG. 6B) may be disposed under the pad protective element.

The pad protective element may include a cured resin. For instance, the pad protective element may include an acrylic resin or an epoxy resin. The pad protective element may be formed via a printing method.

The pad supporting element may be disposed under the pad protective element. The pad supporting element may support the display panel 220 in the pad area PDA to prevent deformation of the display panel 220. A Young's modulus of the pad supporting element may be greater than a Young's modulus of the pad protective element.

The pad supporting element may be arranged to form a pattern. For example, the pad supporting element may be disposed to form substantially the same pattern as the pad supporting element described with reference to FIG. 6C.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
a front area;
a side area peripheral to sides of the front area;

a display panel comprising a flat surface in the front area and a curved surface in the side area; and a protective element disposed on a lower surface of the display panel, the protective element having different thicknesses in the front area and the side area, wherein a lower surface of the protective element in a portion of the side area immediately adjacent to the front area is convex towards a lower direction.

2. The display device of claim 1, wherein a thickness of the protective element disposed in the side area is greater than a thickness of the protective element disposed in the front area.

3. The display device of claim 2, wherein the thickness of the protective element disposed in the side area is variable.

4. The display device of claim 1, further comprising:
a supporting element disposed on a lower surface of the protective element in the front area.

5. The display device of claim 4, wherein the supporting element comprises first patterns extending in a first direction and spaced apart from each other.

6. The display device of claim 4, further comprising:
a supporting element disposed on a lower surface of the protective element in the side area.

7. The display device of claim 4, wherein a Young's modulus of the supporting element is greater than a Young's modulus of the protective element.

8. A display device comprising:
a front area;
a side area peripheral to sides of the front area;
a display panel comprising a flat surface in the front area and a curved surface in the side area; and
a protective element disposed on a lower surface of the display panel, the protective element having different thicknesses in the front area and the side area,
wherein:
the display panel comprises a display area, a pad area, and a bending area between the display area and the pad area; and
the display panel is bent in the bending area based on a bending axis.

9. The display device of claim 8, further comprising:
a pad protective element disposed on a lower surface of the display panel in the pad area.

10. The display device of claim 9, further comprising:
a pad supporting element disposed on a lower surface of the pad protective element.

11. The display device of claim 10, wherein the pad supporting element comprises:
first patterns extending in a first direction and spaced apart from each other; and
second patterns extending in a second direction crossing the first direction and spaced apart from each other.

12. A display device comprising:
a front area;
side areas disposed peripheral to the front area;
a corner area disposed between two adjacent side areas among the side areas;
a display panel comprising a flat surface in the front area and a curved surface in the side areas and the corner area, the display panel further comprising a groove having an inwardly recessed shape in the corner area; and
a protective element disposed on a lower surface of the display panel, the protective element filling at least a portion of the groove.

13. The display device of claim 12, wherein a side surface of the display panel defined by the groove is in contact with the protective element filling at least the portion of the groove.

14. The display device of claim 12, wherein the protective element completely fills the groove.

15. The display device of claim 12, wherein the protective element filling at least the portion of the groove is at least one of stretched and contracted.

16. The display device of claim 12, wherein a Young's modulus of the protective element is less than a Young's modulus of polyethylene terephthalate (PET).

17. The display device of claim 12, wherein a thickness of the protective element disposed on a portion of the lower surface of the display panel in the side areas is greater than a thickness of the protective element disposed on a portion of the lower surface of the display panel in the front area.

18. The display device of claim 12, wherein a thickness of the protective element disposed on a portion of the lower surface of the display panel in the corner area is greater than a thickness of the protective element disposed on a portion of the lower surface of the display panel in the front area.

19. The display device of claim 12, further comprising:
a supporting element disposed on a lower surface of the protective element in the front area.

20. The display device of claim 18, further comprising:
a supporting element disposed on a lower surface of the protective element in the side areas and the corner area.

21. The display device of claim 12, wherein:
the display panel comprises a display area, a pad area, and a bending area positioned between the display area and the pad area; and
the display panel is bent in the bending area based on a bending axis.

22. The display device of claim 21, further comprising:
a pad protective element disposed on a portion of the lower surface of the display panel in the pad area.

23. The display device of claim 22, further comprising:
a pad supporting element disposed on a lower surface of the pad protective element.

* * * * *